United States Patent
Chung

(10) Patent No.: US 8,948,223 B2
(45) Date of Patent: *Feb. 3, 2015

(54) LASER DEVICE

(75) Inventor: Il-Sug Chung, Lyngby (DK)

(73) Assignee: Danmarks Tekniske Universitet, Lyngby (DK)

( * ) Notice: Subject to any disclaimer, the term of this patent is extended or adjusted under 35 U.S.C. 154(b) by 0 days.

This patent is subject to a terminal disclaimer.

(21) Appl. No.: 14/123,686

(22) PCT Filed: Jul. 2, 2012

(86) PCT No.: PCT/DK2012/050241
§ 371 (c)(1),
(2), (4) Date: Mar. 24, 2014

(87) PCT Pub. No.: WO2013/004241
PCT Pub. Date: Jan. 10, 2013

(65) Prior Publication Data
US 2014/0198815 A1    Jul. 17, 2014

Related U.S. Application Data

(60) Provisional application No. 61/561,634, filed on Nov. 18, 2011.

(30) Foreign Application Priority Data

Jul. 4, 2011    (DK) .................................. 2011 70360
Nov. 18, 2011    (EP) ..................................... 11189702

(51) Int. Cl.
*H01S 3/00*    (2006.01)
*H01S 5/187*    (2006.01)
(Continued)

(52) U.S. Cl.
CPC ................. *H01S 5/187* (2013.01); *H01S 5/021* (2013.01); *H01S 5/026* (2013.01);
(Continued)

(58) Field of Classification Search
CPC .................................................... H01S 5/18302
USPC .................................. 372/28, 50.11, 50.124
See application file for complete search history.

(56) References Cited

U.S. PATENT DOCUMENTS 5,056,098 A    10/1991    Anthony et al.
5,072,272 A    12/1991    Omura
(Continued)

FOREIGN PATENT DOCUMENTS

WO    WO 2010/091688    8/2010

OTHER PUBLICATIONS

Chang et al., "Efficient, High-Data-Rate, Tapered Oxide-Aperture Vertical-Cavity Surface-Emitting Lasers," *IEEE Journal of Selected Topics in Quantum Electronics*; vol. 15, No. 3; 1-12; (2009).
(Continued)

*Primary Examiner* — Tuan Nguyen
(74) *Attorney, Agent, or Firm* — Knobbe Martens Olson & Bear LLP

(57) ABSTRACT

The present invention provides a light source for light circuits on a silicon platform. A vertical laser cavity is formed by a gain region arranged between a first mirror structure and a second mirror structure, both acting as mirrors, by forming a grating region including an active material in a silicon layer in a semiconductor structure or wafer structure. A waveguide for receiving light from the region of the mirrors is formed within or to be connected to the region of the mirrors, and functions as an output coupler for the VCL. Thereby, vertical lasing modes are coupled to lateral in-plane modes of the in-plane waveguide formed in the silicon layer, and light can be provided to e.g. photonic circuits on a SOI or CMOS substrate in the silicon.

21 Claims, 5 Drawing Sheets

(51) Int. Cl.
| | |
|---|---|
| H01S 5/02 | (2006.01) |
| H01S 5/026 | (2006.01) |
| H01S 5/183 | (2006.01) |
| H01S 5/042 | (2006.01) |
| H01S 5/062 | (2006.01) |
| H01S 5/12 | (2006.01) |
| H01S 5/10 | (2006.01) |

(52) U.S. Cl.
CPC ........ *H01S 5/18319* (2013.01); *H01S 5/18386* (2013.01); *H01S 5/0215* (2013.01); *H01S 5/0424* (2013.01); *H01S 5/0425* (2013.01); *H01S 5/06226* (2013.01); *H01S 5/1228* (2013.01); *H01S 5/1234* (2013.01); *H01S 5/18311* (2013.01); *H01S 5/1032* (2013.01); *H01S 5/1838* (2013.01)
USPC .................................. 372/38.02; 372/50.11

(56) References Cited

U.S. PATENT DOCUMENTS

| | | | |
|---|---|---|---|
| 5,222,071 A | | 6/1993 | Pezeshki et al. |
| 5,408,486 A | | 4/1995 | Shoji |
| 6,826,223 B1 | * | 11/2004 | Meyer et al. .................... 372/96 |
| 2004/0213316 A1 | | 10/2004 | Lipson |
| 2007/0121694 A1 | | 5/2007 | Okamoto |
| 2007/0201526 A1 | | 8/2007 | Hori |
| 2007/0291808 A1 | | 12/2007 | Ledentsov et al. |
| 2008/0298418 A1 | * | 12/2008 | Uchida .................... 372/50.124 |

OTHER PUBLICATIONS

Ferrier et al., "Vertical microcavities based on photonic crystal mirrors for III-V/Si integrated microlasers," *Photonic Crystal Materials and Devices VIII*; de la Rue, ed.; Proc. of SPIE vol. 6989; 12 pp.; (2008).

Ferrier et al., "Surface emitting microlaser based on 2D photonic crystal rod lattices," *Optics Express*; vol. 7, No. 12; 9780-9788; (2009).

Hadley, "Effective index model for vertical-cavity surface-emitting lasers," *Optics Letters*; vol. 20, No. 13; 1483-1485; (1995).

Miller, "Device Requirements for Optical Interconnects to Silicon Chips," *Proceedings of the IEEE*; vol. 97, No. 7; 1166-1185; (2009).

* cited by examiner

LASER DEVICE

CROSS REFERENCE TO RELATED APPLICATIONS

This application is a U.S. National Phase Application of PCT International Application Number PCT/DK2012/050241, filed on Jul. 2, 2012, designating the United States of America and published in the English language, which is an International Application of and claims the benefit of priority to Danish Patent Application No. PA 2011 70360, filed on Jul. 4, 2011, European Patent Application No. 11189702.1, filed on Nov. 18, 2011, and U.S. Provisional Application No. 61/561634, filed on Nov. 18, 2011. The disclosures of the above-referenced applications are hereby expressly incorporated by reference in their entireties.

FIELD OF THE INVENTION

The present invention relates to the field of optical communication, and in particular it relates to high speed optical communication using semiconductor lasers. Even more particularly the invention relates to a semiconductor laser suitable for use in optical interconnects in or to silicon chips. The present invention also relates to a method of fabricating the laser and a method of modulating the laser when in use.

BACKGROUND OF THE INVENTION

In short-distance optical interconnects applications, low energy consumption as well as high transmission speed of the building block devices is becoming a key technological issue as the data transmission bandwidth increases. Thus, the figure of merit is energy consumption per transmitted bit. According to a recent technology roadmap provided in [1], a few 10 s fJ/bit is required in 2015-2020 for light transmitters of chip-level optical interconnects.

As a light emitter, vertical-cavity surface-emitting lasers (VCSELs) are one of preferable existing solutions. It is because their fabrication technology is matured and their energy consumption is much smaller than that of edge-emitting lasers due to their small active material volume. To send a bit signal, output light intensity of a light emitter should be modulated. There are two ways of modulating the output light intensity; direct modulation and indirect (or external) modulation. Among these two approaches, direct modulation is easier to implement since external modulation approach needs an external modulator.

In the direct modulation scheme, the current injection to a laser is modulated. This leads to the intensity modulation of the output light. A state-of-the-art result is reported in [2]. The transmission speed was 35 Gb/s, the energy consumption excluding the RF driver circuitry was 12.5 mW, and the emission wavelength was 980 nm. The demonstrated energy per bit of 357 fJ/bit (=12.5 mW/35 Gb/s) is remarkably small but is not sufficient for the aforementioned applications. The weakness of this approach is that it is difficult to further increase the speed or reduce the energy consumption: Speed of a laser diode is decided by its intrinsic response and circuit response. The intrinsic speed is defined by −3 dB bandwidth of the intrinsic frequency response which is proportional to relaxation oscillation frequency, $f_r$:

$$f_r \propto \sqrt{\frac{I - I_{th}}{V_p}} \qquad (1)$$

where I is the injection current, $I_{th}$, threshold current, and $V_p$, modal volume. In order to obtain higher intrinsic speeds, the injection current needs to be higher while the modal volume, preferably smaller. In the demonstrated VCSEL, the modal volume is not likely to be further reduced. It is because its transverse mode size and effective cavity length that determine the modal volume are difficult to be further reduced. In the demonstrated VCSEL, the oxide aperture diameter of 3 μm is already the smallest with a reasonable optical loss. If one decreases the oxide aperture size below 3 μm to obtain a smaller modal volume, the optical loss dramatically increases, leading to higher $I_{th}$. In Eq. (1), a higher $I_{th}$ decreases the speed. Regarding the injection current, if one increases the current for higher intrinsic speed, it will result in higher energy consumption. On the other hand, if one decreases the current for smaller energy consumption, it will result in slower intrinsic speed. Thus, it is difficult to further increase the speed and decrease the energy consumption simultaneously, based on the conventional VCSEL structure. One should also consider that high injection current is detrimental to long-time stability of small-volume lasers. The speed related to the circuit response is mainly decided by the series resistance and capacitance of the laser structure. In the demonstrated VCSELs, these parasitic terms were already tightly suppressed. Thus, a significant improvement in speed related to parasitic terms is not expected.

As discussed above, the transverse mode size of 3 μm is already the smallest with a reasonable optical loss. In VCSELs, the effective cavity length is the sum of a nominal cavity length and field penetration into distributed Bragg reflectors (DBRs). Since one needs an optical cavity with a certain thickness that includes an active region for light generation, one cannot significantly reduce the effective cavity length, either.

Thus, there is a limit on the speed and energy consumption of directly-modulated VCSEL structures, in currently know solutions. For further improvement beyond the state-of-the-art energy per bit values, one needs an innovative laser structure.

SUMMARY OF THE INVENTION

It is an object of the present invention to provide a novel semiconductor laser which can increase speed and/or reduce energy consumption of semiconductor lasers as compared to the semiconductor lasers presently being used for short-distance optical interconnects. It is also an object of the invention to provide a novel method for modulating a semiconductor laser and a novel optical interconnect based on the novel semiconductor laser.

It is yet another objective of the present invention to provide a method for producing a semiconductor laser capable of overcoming the above mentioned and presently perceived fundamental limitations of the prior art on modulation speed and energy consumption.

It is a further object of the invention to show improvements in the techniques for interconnecting photonic circuits by using an optical interconnect based on the novel semiconductor lasers according to the first aspect of the invention.

The above described objects and several other objects are intended to be obtained in the following aspects of the invention.

In a first aspect of the invention by providing a laser comprising a cavity defined by first and second mirroring structures formed in semiconductor layers on a substrate and being arranged to support light oscillation along an oscillation axis normal to a plane of the substrate. The first mirroring structure is in the form of a grating formed in a first semiconductor material layer and an active gain material is provided within the first mirroring structure. Electric contacts for drawing an electric current through the active gain material are provided to facilitate lasing.

In one embodiment, the first semiconductor material layer comprises a III-V semiconductor material.

In another embodiment, the first semiconductor material layer comprises a II-VI semiconductor material.

In yet another embodiment, the first semiconductor material layer comprises a Si/Ge quantum well.

The first and second mirroring structures act as first and second reflectors, respectively, of the laser structure.

Above and hereafter, the 'gain material' or 'active material' designates the material such as quantum dots, quantum wires, and quantum wells, etc., where light is generated. The 'active region' represents the gain (or active) material as well as surrounding region or layers such as buried hetero-structure (BH) or separate confinement hetero-structure (SCH), where carriers (electrons and holes) are significantly concentrated.

The basic idea of the invention is thus a laser with the active (gain) region is embedded or buried in a mirroring structure such as e.g. a grating. This reduces the volume of the optical mode and the active region, meaning higher modulation speed and lower energy consumption than existing laser diodes. Fabrication process steps are similar as matured VCSEL fabrication technologies. In the following, a number of further aspects, example embodiments and optional features or elements will be described. Features or elements described in relation to one embodiment or aspect may be combined with or applied to the other embodiments or aspects where applicable. For example, structural and functional features applied in relation to the active grating laser may also be used as features in relation to the method for modulating or fabricating the active grating laser by proper adaptation and vice versa. Also, explanations of underlying mechanisms of the invention as realized by the inventor are presented for explanatory purposes, and should not be used in ex post facto analysis for deducing the invention.

In example embodiments of the laser according to the first aspect of the invention the second mirroring structure is a periodic passive grating.

In further example embodiments of the laser according to the first aspect of the invention the first mirroring structure with a gain material is a periodic active grating. An active grating is in this context to be understood as a grating comprising one or more active regions.

In some embodiments of the laser according to the first aspect of the invention the second structure is provided as a distributed Bragg reflector (DBR).

A periodic or nearly periodic grating can be designed to provide a broadband high reflectivity spectrum that is, for instance, higher than 99.9% over a wavelength range of 150 nm. In the present invention, the first grating of an active grating laser should be an active grating with active material elements embedded within the grating. The second grating can be either a passive grating without any active material or a conventional DBR.

In some embodiments, the first mirroring structure and/or the second mirroring structure comprises a grating with a modulated periodicity, wherein the grating is configured for focussing a light field reflected by the grating. In this way, transverse confinement of light in the cavity may be obtained.

The gratings may also be non-periodic. Two non-periodic gratings can be designed to provide strong resonance and strong field confinement around them. In this case, the strong resonance and field confinement occurs only when they are put closely together. A stand-alone single grating may not have a high reflectivity. Thus, in that case, both the first and second gratings are required. At least one of them should include active material elements.

In some embodiments, one of the first mirroring structure or the second mirroring structure is or comprises a non-periodic grating, the first and second mirroring structures being arranged to jointly support a resonance in an optical field.

In example embodiments of the laser according to the first aspect of the invention the electric contacts for drawing an electric current through the active gain material are positioned in the first mirroring structure on opposite sides of the active gain material as seen normally to said oscillation axis.

In further example embodiments of the laser according to the first aspect of the invention the electric contacts for drawing an electric current through the active gain material comprise p- and n-doped contact region layers forming part of the first mirroring structure and being positioned vertically above and below the active gain material layer, respectively.

In yet further example embodiments of the laser according to the first aspect of the invention the second mirroring structure is formed by a periodic refractive index grating region in a silicon layer, and a waveguide is formed in the silicon layer, the waveguide having an end part formed within or abutting the grating region of the second mirroring structure to facilitate coupling of light from the second mirroring structure to the waveguide.

In still further example embodiments of the laser according to the first aspect of the invention the mirroring structure(s) comprises periodically arranged perforations forming a grating region in one or two dimensions. In some embodiments the perforations may be filled with a filling medium so that the refractive index changes periodically in the grating region in directions normal to said oscillation axis.

In example embodiments of the laser according to the first aspect of the invention the gain material is arranged in the semiconductor material layer and so that the gain material layer is not in contact with the filling medium in the perforations.

In still further example embodiments of the laser according to the first aspect of the invention the gain material layer is structured so as to avoid regions bordering the perforations.

In some example embodiments of the laser according to the first aspect of the invention portions of the gain material layer border the perforations but are separated from the filling medium by dielectric material deposited on surfaces in the perforations.

In example embodiments of the laser according to the first aspect of the invention the gain material is a quantum dot, quantum wire, or quantum well structure.

In example embodiments of the laser according to the first aspect of the invention the gain material is a quantum dot, a quantum wire, or a quantum well structure included in a BH structure The perforations may be provided in the form of holes extending through a defined region of the layer structure, called the grating region. The perforations may be filled by air or any other material with a refractive index substantially different from the layer structure. The grating region may comprise a one-dimensional (1D) or two-dimensional (2D)

grating formed by semiconductor material layer parts and regions being formed in the semiconductor material layer and having refractive indices much lower or much larger than the refractive index of semiconductor material layer.

In a second aspect, the invention provides a method for providing modulated laser light comprising providing a laser according to the first aspect of the invention and applying a modulated voltage bias between the electric contacts to modulate laser action of the laser.

In example embodiments of the method according to the second aspect of the invention one or more digitally modulated electric data signals are received and the modulation of the voltage bias (and resultant modulation of current) is performed according to the digital modulation of the data signals, typically in the range of several tens of gigabits per second range.

In example embodiments of the method according to the second aspect of the invention the gain material and the first grating is designed to support lasing in the laser at a predetermined wavelength and to provide a reflection of the first grating at the predetermined wavelength, the reflection being substantially independent of the current applied between the electric contacts.

In a third aspect of the invention there is provided an optical interconnect comprising one or more lasers according to the first aspect of the invention for generation of optical data signals based on received electric data signals.

The optical interconnects may be implemented on or between an integrated circuit(s), such as a central processing unit of an electronic device. Such optical interconnects have the advantage of providing no crosstalk, much higher transmission bandwidth, feasible clocking, lower energy consumption for distances longer than several hundred micrometers. Compared to existing technologies for optical interconnects, an optical interconnect according to the present invention involves the advantages of higher obtainable data rates and lower power consumption.

In a fourth aspect, the invention provides a method for hybridising a semiconductor laser on a silicon platform, the method comprising the following steps: A second mirror structure is provided on a silicon substrate. Then an epitaxial structure based on III-V semiconductors is wafer-bonded onto the patterned silicon substrate. The epitaxial structure is provided with layer for a first mirror structure, and a sacrificial layer. Metal contacts and corresponding implantation regions for the contacts are formed. A first mirror structure which includes an active material is patterned, and finally the sacrificial layer is removed.

The sacrificial layer can be replaced with a low refractive index material such as $SiO_2$. In this case, this low index material is deposited onto the III-V epi structure before the wafer bonding, and this III-V epi structure does not include a sacrificial layer.

In some embodiments, the low refractive index material has a refractive index at an operating wavelength of the laser of about 2 or less, such as about 1.6 or less, or even such as about 1.5 or less. In this way, a relatively high index difference may be achieved between the low refractive index material and the first mirroring structure. A high index difference may improve the contrast of the first mirroring structure, e.g. to often broaden the reflectivity bandwidth of the structure; bandwidths of >100 nm with a reflecvitiy higher than 99.9% are obtainable.

Hence, in a fifth aspect, the invention provides a method for hybridising a semiconductor laser on a silicon platform, the method comprising the following steps: Regions of a second mirror structure are provided on a silicon substrate. A low refractive-index material is deposited onto a III-V epi-structure forming a first mirror layer. The epi-structure is wafer-bonded onto the silicon substrate. Metal contacts and corresponding implantation regions for the contacts are formed. A first mirror structure in the form of a grating is patterned, where this first mirror structure includes an active material.

In example embodiments of the method according to the fourth and fifth aspects of the invention, the step of providing a second mirror structure comprises patterning a second grating, while in other alternatives the second mirror structure is provided as a DBR.

In further example embodiments of the method according to the fourth and fifth aspects of the invention the step of providing a second mirror structure may comprise the step of providing a waveguide for coupling the light out of the laser structure. The waveguide may be provided in a patterning process. In such cases the light will be available in the waveguide to a planar integrated photonic circuit. In other alternatives light may be coupled directly to air from the surface of the semiconductor structure, making the light available on a top surface of the semiconductor structure.

The invention has the following advantages over state-of-the-art conventional VCSELs applying an active region embedded in the optical cavity [2]:

Compared to conventional VCSELs, an active grating laser according to this invention will have an optical mode volume, $V_p$ smaller by a factor of e.g., 10 and an active material volume by a factor of e.g., 5. These smaller volumes of the optical mode and the active material can provide higher modulation speed and lower power consumption.

Higher obtainable modulation rate: According to Eq. (1), the maximum obtainable modulation speed of an active grating laser is expected e.g., 3 times ($\approx 10^{1/2}$) higher than that of the conventional VCSELs, provided that other conditions such as differential gain, internal efficiency, and the parasitic circuit components are similar to those of the conventional VCSELs.

Lower power consumption: The injection current required to reach a threshold carrier density is proportional to the active material volume. Thus, the energy consumption which is proportional to the injection current, can be e.g., 5-times smaller than that of the conventional VCSELs, provided that the threshold material gain of the active grating laser is similar to that of the conventional VCSELs.

Then, the energy per bit of an active grating laser can ideally be 15-times smaller than that of presently known VCSEL. This corresponds to an energy-per-bit value of a few 10 s fJ/bit while that of the state-of-the-art VCSEL is typically several 100 s fJ/bit (c.f., Ref [2]).

The basic structure of an active grating laser is the cavity formed by the two reflectors formed in layers on a substrate, and being arranged to support strong field resonance and confinement between or around the two reflectors. Typical dimension of the field confinement ranges from sub-wavelength to a few wavelength. The light oscillation axis is normal to the substrate, i.e., vertical in the case of periodic grating. Other laser types may be formed in layered structures without having vertical cavities, such as edge-emitting lasers. These lasers are based on a very different design with an in-plane oscillation axis and a typical dimension of field confinement along the oscillation axis is a few hundreds of wavelength. They, thus, represent a different technical field than the present invention. In preferred embodiments of the invention, the laser couples out radiation vertically to the air or laterally to an in-plane waveguide through the bottom (the second) grating acting as well as a mirror, making the laser in these embodiments a vertical-cavity surface-emitting laser (VCSEL, a special group of VCLs), or a vertical-cavity in-plane-emitting laser, respectively. Other types of lasers may be surface emitting without being vertical-cavity lasers (VCLs), e.g. if the out-coupling is based on emission of scattered light from the cavity [4].

The wavelength dependent reflectivity of the reflectors, the wavelength-dependent resonance of two collective non-periodic gratings, and the active material are selected to support lasing in the active grating laser at a predetermined wavelength as is customary in the field, typical wavelengths are between 650 nm-2000 nm, often around 850 nm, 980 nm, 1050 nm, 1310 nm or 1550 nm.

In various embodiments of the various aspects of the present invention the first grating is a periodic active grating while the second grating may be a periodic passive grating. In the vertical emission type laser, the emitting grating has a typical reflectivity of around 99.5% while the non-emitting grating has a typical reflectivity of 99.9%. Either the active or the passive grating can be an emitting one with a lower reflectivity than the other grating.

In various embodiments of the various aspects of the present invention the second grating may be formed by a periodic refractive index grating region in a silicon layer, and a waveguide may be formed in the silicon layer of the laser, with an end part of the waveguide formed within or abutting the grating region of the second grating to facilitate coupling of light from the grating region to the in-plane waveguide. This has the advantage of providing a direct, low-loss coupling to an in-plane waveguide in the silicon layer.

In any of the embodiments of the laser according to the first aspect of the invention the gain material can be quantum dots, quantum wires, and/or quantum wells positioned or formed within the semiconductor material layer. Also, in any of the embodiments of the laser according to the first aspect of the invention the gain material may be held within, enclosed by, embedded in, and/or buried in the semiconductor material. This host material can be a planar layer or a BH structure, depending on the type of gain material and current injection method. The gain material, also referred to as the active material is typically made of III-V semiconductor materials.

Quantum wells, quantum wires, and quantum dots have one-, two-, and three-dimensional structures, respectively, with characteristic dimension of 5-15 nm. Quantum wells can be formed in the layer structure by a thin semiconductor material layer (e.g. GaAs) sandwiched between two layers with a wider band gap (e.g. AlAs). Quantum wires and quantum dots can be formed in the layer structure by a wire like and a dot like semiconductors, respectively. These structures may for example be grown by molecular beam epitaxy or metal organic vapor phase epitaxy.

Contact between the gain material and the air in the perforations is preferably avoided in order to avoid unwanted surface recombination at the air-active material interface when current is drawn through the gain material. This may be achieved in many different ways. In one embodiment, the layer including the gain material is formed to be a BH structure during epitaxial growth. After growing the layer including the gain material, only desirable part of the layer is kept and the remaining is removed by etching. This patterning size, shape and position are determined by considering perforation size, shape and position. Then, the sample is re-grown. Typically, the re-grown part has specific combination of doping to facilitate current injection to the layer including the gain material. After finishing re-growth, the epitaxy sample surface may need polishing to make the surface smooth. When we make perforations typically by etching, we can prevent the buried active material from being exposed to the air, by precise aligning. This embodiment is especially suitable when the gain material is quantum wells. In another embodiment, portions of the gain material layer bordering the perforations have been covered by dielectric material deposited inside the perforations. This embodiment is especially suitable when the gain medium is quantum wells.

In various embodiments of the various aspects of the present invention different configurations for the electric contacts for drawing current through the gain material are possible. The electric contacts may be p- and n-doped layers forming part of the layer structure and be positioned above and below, respectively, the semiconductor material layer holding the gain medium. In prior art VCLs the doped layers are formed to sandwich at least the cavity, and typically the entire laser structure. In the laser of the present invention the doped layers sandwiches only the relatively thin semiconductor material layer of the grating acting as a mirror. As the p/n-doped layers are part of the layer structure, it follows that the p/n-doped layers will typically also be perforated by the periodic perforations forming the grating region.

The electric contacts may be positioned or formed in the layer structure, preferably in the same layer as the gain medium layer, on opposite sides of the embedded active/gain medium as seen in the plane of the layers. The current is then drawn horizontally through the gain region.

The electrical confinement in the laser according to the present invention is also different from in prior art VCLs. Preferably, the gain medium is only provided in a central part of the first grating.

An example of two dimensional (2D) gratings acting as mirrors for use in VCSELs can be found in e.g. [3]. The present invention differs from the structure of Reference [3] in several ways, one of them being that in the present invention, the active region is formed within one of the gratings, whereas in Reference [3] the cavity including the active region is located between the gratings. However, extensive references to VCSEL technology are made throughout this description because that technology is considered the closest prior art.

The present invention is particularly advantageous as it applies matured VCSEL technologies exhibiting eminent single-mode property and mode control in general. Further, the use of VCSEL technology allows for uncomplicated packaging.

The above aspects and other aspects of the invention will be apparent from the following description with reference to the described embodiments.

BRIEF DESCRIPTION OF THE FIGURES

Embodiments of the invention will now be described in more detail with reference to the accompanying figures. The figures show one way of implementing the present invention and is not to be construed as being limiting to other possible embodiments falling within the scope of the attached claim set.

FIG. 1A is a top view of the in-plane-emitting laser.

FIG. 1B is a cross-sectional view along Line A1-A2 in FIG. 1B.

FIG. 1C is a cross-sectional view along Line B1-B2 in FIG. 1B.

FIG. 1D is a cross-sectional view along Line C1-C2 in FIG. 1B.

FIG. 1E is a cross-sectional view along Line D1-D2 in FIG. 1B.

DETAILED DESCRIPTION OF THE INVENTION

Figure 1A:
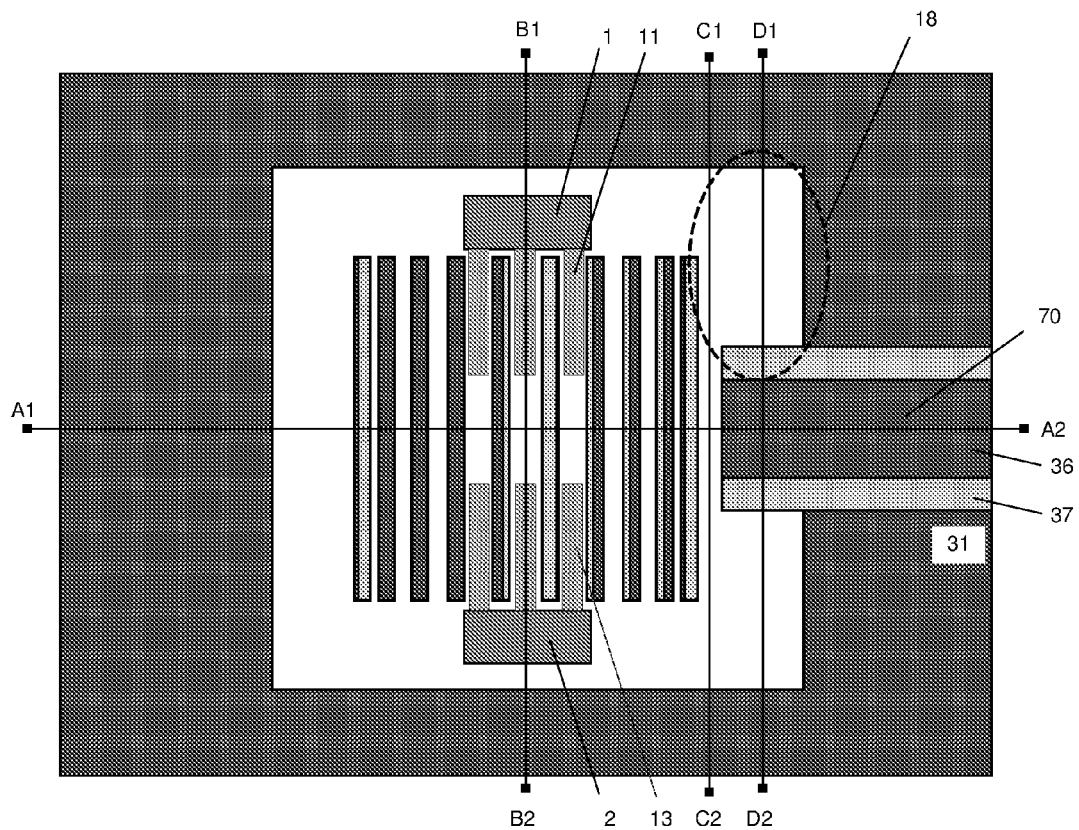
FIGS. 1A-1E are schematic illustrations of a vertical-cavity in-plane-emitting laser comprising a nearly-periodic active grating mirror and a periodic passive grating mirror.
Figure 1B:
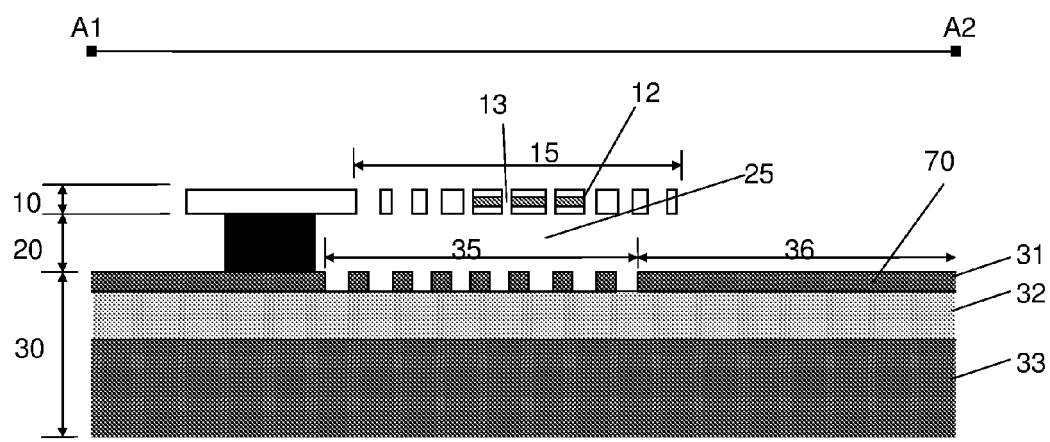

An example embodiment of a laser according to the invention is illustrated in FIGS. 1A-1E. The cross-sectional device structure along the line A1-A2 of FIG. 1A is shown in FIG. 1B.

The basic structure of the invention will be best understood by first considering FIGS. 1A and 1B together. The laser structure comprises an active grating region 15, an air cavity 25, and a passive grating region 35. The active grating region 15 and the passive grating regions 35 are typically placed on each side of the air cavity 25 to form a resonant structure forming the laser cavity. Both the active 15 and the passive 35 gratings may be periodic gratings and work as high reflective mirrors. The gratings 15, 35 are typically periodic in a direction in parallel with the planes of the semiconductor structure.

The periodicity of the active grating 15 may be spatially modulated to make the reflected light focused. This results in transverse optical confinement. Both of or either one of the two gratings can be designed to have focused reflected light. For this purpose the grating parameters such as duty cycle, thickness, periodicity, shape, etc can be gradually modulated.

The active grating 15 is made in a III-V semiconductor layer 10 and includes active elements in active region 12. The III-V semiconductor layer 10 is adjacent to a sacrificial etching layer 20. The sacrificial etching layer 20 may be a III-V semiconductor layer. An air gap 25 may be formed between the active and passive gratings by e.g. selectively etching the etching layer. On the opposite side of the sacrificial etching layer 20 there is a silicon (Si) layer 31 of a wafer 30. The Si layer 31 is separated from the bulk of the wafer 30 by a buried oxide layer 32.

The passive grating 35 is made in the Si layer 31. The passive grating 35 is arranged adjacent an in-plane Si waveguide 36 so as to allow coupling of light from the laser structure to the waveguide 36.

The active material included in the active region 12 may be in the form of quantum wells. In this case, in order to prevent surface recombination, the active region 12 may be a BH structure, or the side wall of perforations 12 may be passivated by non-conducting material. The active material may be in the form of quantum dots. In this case, the active region 12 does not need to be a BH nor does it require surface passivation, since surface recombination rate for quantum dots is fairly low. Any other relevant and known active material can be employed, and employing the BH will be decided, depending on the laser design. The cavity 25 in this embodiment is air but any other low refractive-index material such as $SiO_2$ can be used. The low refractive-index material should preferably have a refractive index less than about 2 at an operating wavelength of the laser. In the case of using a low refractive index material instead of air, this layer can be deposited onto the III-V epi structure before bonding. Since this III-V epi structure does not include a sacrificial layer 20, the sacrifical etching is not needed to form the air gap 25.

Light is generated within the active region 12 and is resonated in the cavity 25 between two gratings 15, 35 acting as mirrors. Part of light which is incident onto the passive grating mirror 35 is routed (coupled) to the in-plane output waveguide 36, e.g. by a coupling mechanism. This routed light is thus available for a planar photonic circuit as light emission 70 in a direction in a plane parallel with the layers of the semiconductor structure, and may be used for optical interconnects between photonic circuits. The reflectivity of the passive grating 35 that is connected (coupled) to the output waveguide may for example be 99.5% due to light emission and coupling loss, while the reflectivity of the active grating 15 may be, for example, as high as 99.9%.

Figure 1C:
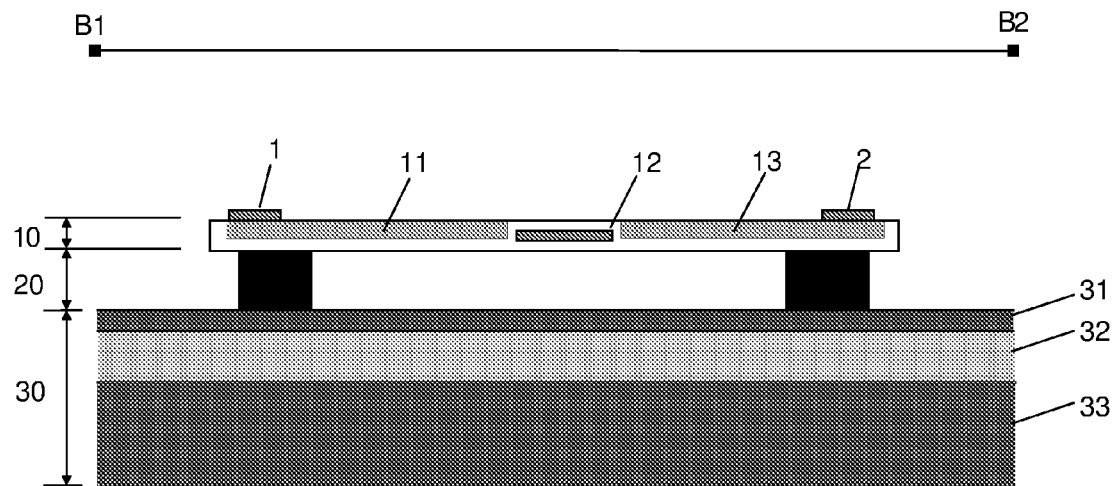
Figure 1D:
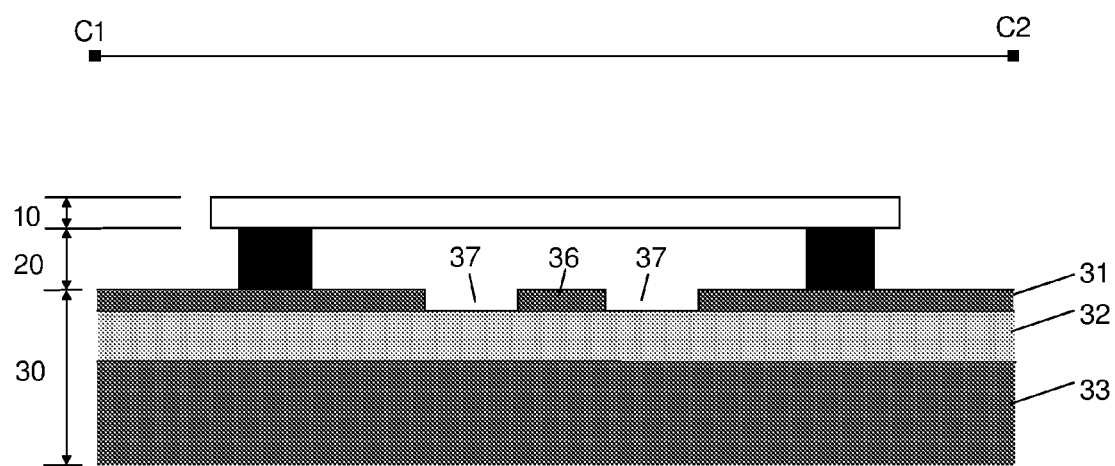
Figure 1E:
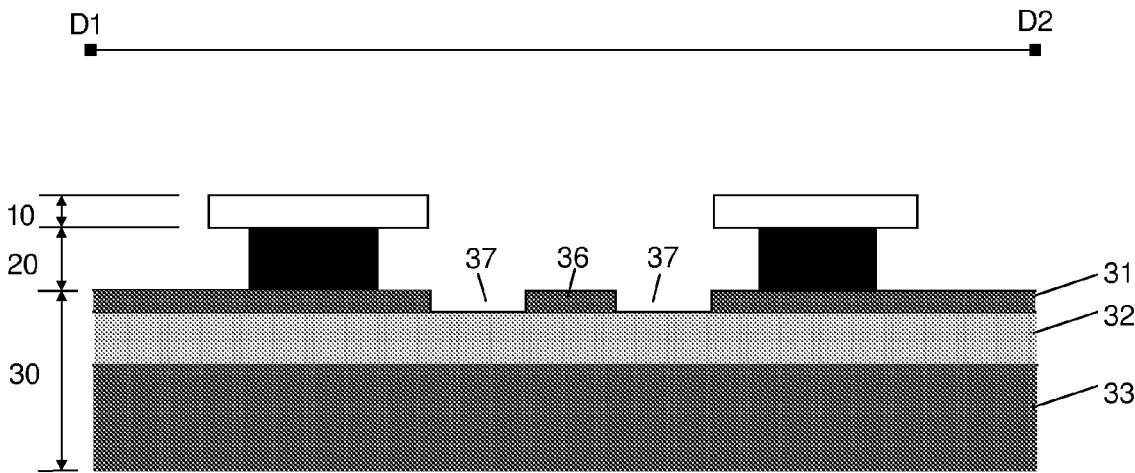

By considering FIGS. 1D and 1E together with FIG. 1A, it may be seen that the output waveguide 36 is formed by making a pair of trenches 37 on each side of the waveguide 36. The trenches 37 may typically be provided in parallel with the waveguide 36.

Turning now to FIG. 1C it is illustrated—using a cross-section along the line B1-B2 in FIG. 1A—how the active region 12 may be embedded in the grating, e.g. roughly in the middle of the grating region. The active region 12 typically may have an elongated form being longest in the direction of the grating lines. FIG. 1C also illustrates how carriers may be delivered to the active region 12 via contact regions 11 and 13. The contact regions 11 and 13 are p and n doped, respectively. Doping may be provided by implantation. As a result, the current to activate the active region 12 can be supplied through metal contacts 1 and 2.

Figure 2:
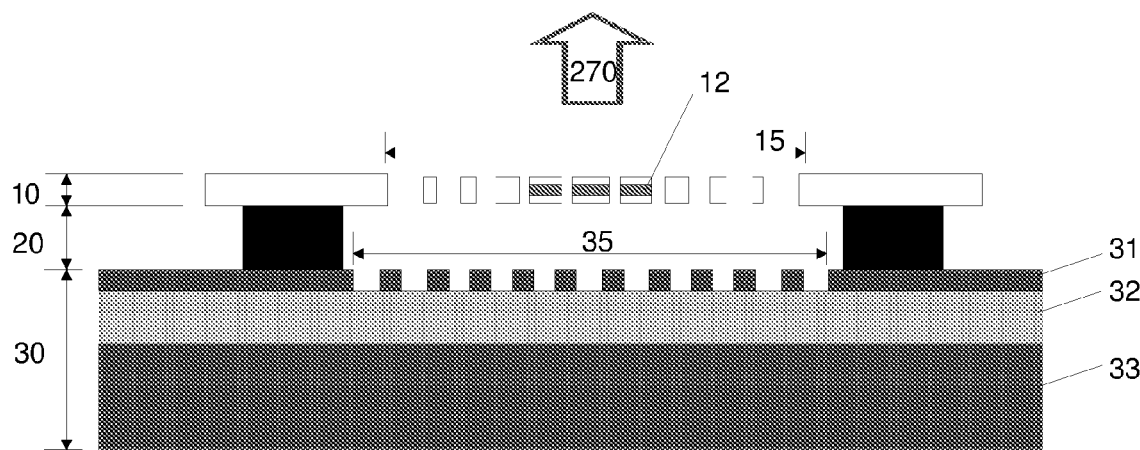
FIG. 2 is a cross-sectional view of a vertical-cavity surface-emitting laser that comprises a nearly-periodic active grating mirror and a periodic passive grating mirror.

A further example embodiment of the laser according to the first aspect of the invention is shown in FIG. 2. This embodiment is similar to the embodiment in FIGS. 1A-1E, but differs in that the light emission 270 occurs in a direction vertical to the layers of the semiconductor structure forming the laser. The light may in this embodiment be coupled directly to an air volume external to the semiconductor material for transmission to other photonic circuits or into external optical waveguides. Accordingly, there is no in-plane output waveguide. Thus, the light output direction can be chosen between the vertical free space emission and the in-plane waveguide emission, as required by the application. The steps of fabrication will be similar to the embodiment illustrated in FIGS. 1A-1E, except that the waveguide 36 and trenches 37 need not be formed.

Figure 3:
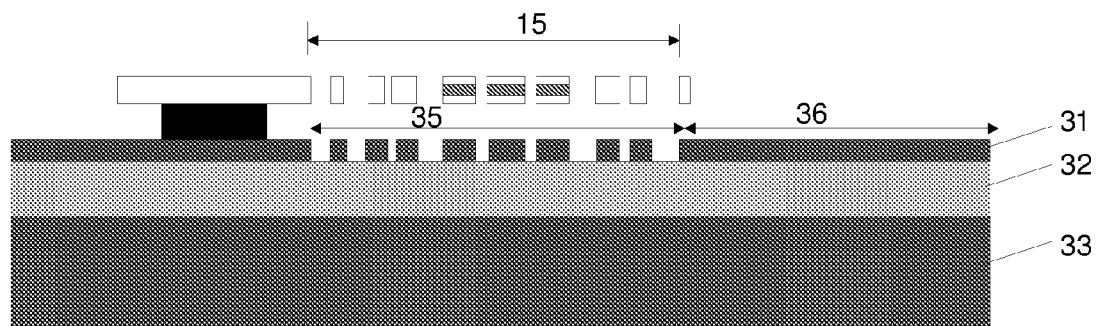
FIG. 3 is a cross-sectional view of a vertical-cavity surface-emitting laser that comprises two non-periodic gratings.

Yet an example embodiment of the laser according to the first aspect of the invention is shown in FIG. 3. In this embodiment, the grating regions 15 and 35 are non-periodic. A single grating region 15 or 35 alone does not have a high reflectivity. But, when they are put closely together, strong resonance and field confinement can occur around the centre of the gratings 15, 35. Light may be coupled laterally into an in-plane output waveguide 16 so as to provide light to a planar photonic circuit. Similar to the embodiment illustrated in FIG. 2, vertical emission may also be possible in this embodiment. The steps of fabrication are the same as for the embodiment illustrated in FIGS. 1A-1E.

Figure 4:
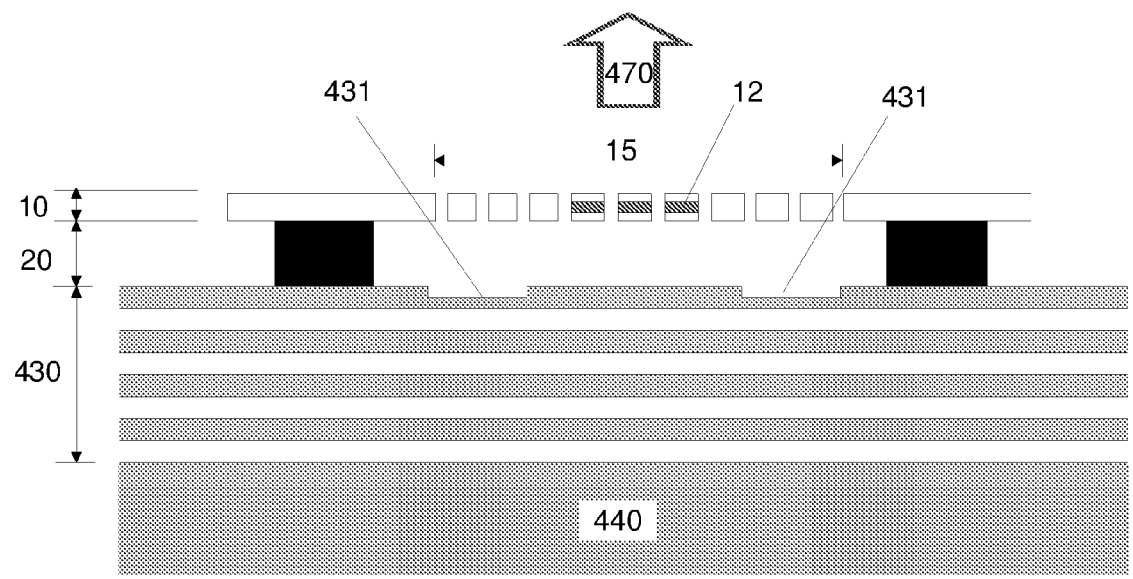
FIG. 4 is a cross-sectional view of a vertical-cavity surface-emitting laser that comprises an active grating mirror and a DBR. The optical mode profile is mainly defined by a shallow surface etching.

A further example embodiment of the laser according to the first aspect of the invention is shown in FIG. 4. In this embodiment the second mirroring structure is provided as a DBR 430. The periodic active grating 15 and the DBR 430 act as the two mirroring structures of a laser. The periodic grating 15 has high reflectivity. The light is emitted in a direction perpendicular to the planes of the semiconductor structure, i.e. in the direction of the arrow 470 on FIG. 4. The optical mode confinement can be obtained by providing one or more trenches 431. If the grating parameters are spatially modulated as in FIG. 1A to result in a curved reflection wave front, the transverse optical confinement can be obtained without the trench(es) 431.

A DBR is formed onto a substrate 440 prior to forming a pair of trench(es) 431, as illustrated on FIG. 4. Then, a III-V epi including layers 10 and 20 is wafer-bonded, as in the other aspects of the invention, and the remaining process steps are similar to the embodiment illustrated in FIGS. 1A-1E.

Figure 5:
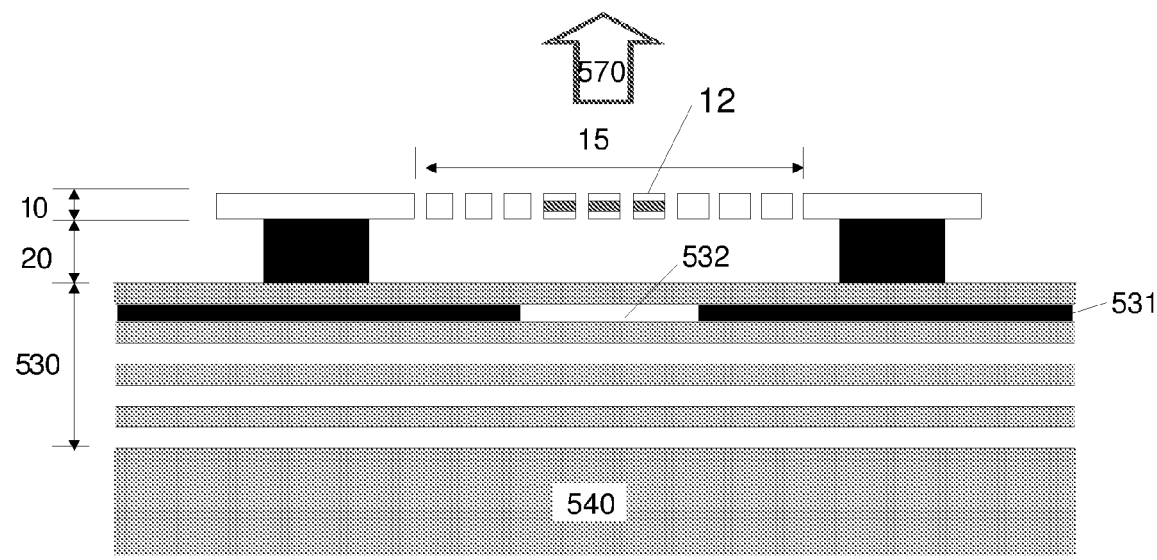
FIG. 5 is a cross-sectional view of a vertical-cavity surface-emitting laser that comprises an active grating mirror and a DBR. The optical mode profile is mainly defined by an oxide aperture.

Still yet an example embodiment of the laser according to the first aspect of the invention is shown in FIG. 5. This employment is the same as the embodiment illustrated in FIG. 4, except that the method of optical confinement is somewhat different. In this embodiment, one layer 531 of the DBR 530 is oxidized during the fabrication process so as to define an oxide aperture (an un-oxidized region) 532 in the finished laser structure. Since the central un-oxidized region 532 has a higher refractive index than the oxidized part, the optical mode will be transversely confined within the diameter of the oxide aperture 532. The fabrication flow is similar as the embodiment in FIG. 4, except that instead of making a trench 431, the layer 531 needs to be oxidized.

An example method of hybridizing a laser on silicon support according to the fourth aspect of the invention is as follows: First, all patterning onto the Si such as the second grating 15 and the waveguide 36, e.g. by forming the waveguide trench 37, is performed. Then, a III-V epi-structure which include the grating layer 10 and the sacrificial layer 20 is wafer-bonded to the patterned SOI wafer 30. Then, the implantation is done and the metal contacts 1 and 2 are formed. Then, the patterning of the first grating 15 and removal of sacrificial layer can be performed. The corner region 18 in FIG. 1B is aimed to help prevent the membrane grating layer 10 from bending downward or collapsing. Performing the processing steps in a different order may be possible depending on fabrication feasibility.

Figure 6:
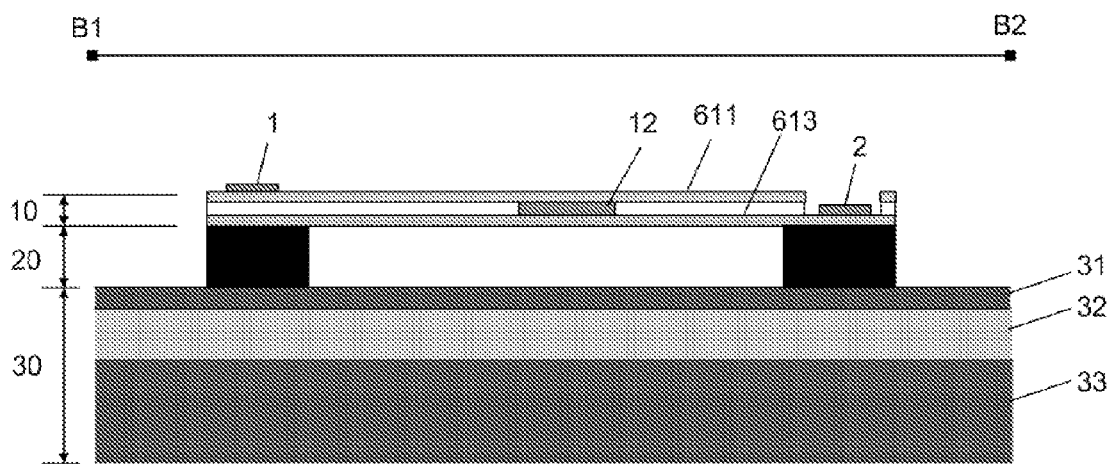
FIG. 6 is a cross-sectional view of an alternative configuration of the electric contacts.

FIG. 6 shows a cross-section corresponding to the one shown in FIG. 1C, but with an alternative configuration of the electric contacts. Therefore, only the differences between the two embodiments will be discussed here. In this case, the electric contacts comprise a p-doped contact layer 611 being arranged above the active gain material region 12, and an n-doped contact layer 613 being arranged below the active region 12. The n- and p-doped contact layers form a part of the first mirroring structure. The vertical position of the n- and p-doped contact layers may be interchanged. Metal contacts 1 and 2 may also in this embodiment be located on opposite sides of the active gain material region as seen in the plane of the layers.

Mode/Optical Confinement

A number of known techniques are available for defining the position of the optical mode in a VCL, also referred to as the mode confinement or optical confinement. Since lasers according to embodiments of the present invention have a mirror structure that is different from known VCLs, in that it also holds the active region, it is relevant to discuss the optical confinement techniques most suitable for the lasers according to the various embodiments of the invention.

In the embodiments where at least, one periodic and highly reflective grating is employed, spatially varying grating parameters to result in a focused wave front while keeping high reflectivity, can define optical mode in transverse direction. In this approach, the vertical confinement results from the high reflectivity of two reflectors. In the embodiments with two periodic and highly reflective gratings, the spatial modulation of grating parameters can be applied to one or both of the gratings. This spatially modulated grating approach can be applied also to the embodiments with a periodic and highly reflective grating and a DBR. In embodiments where two non-periodic gratings are employed, two gratings are collectively designed to result in strong vertical and transverse field confinement. Here, 'periodic' grating includes the nearly periodic grating with spatial modulation. In embodiments where a DBR is employed, the DBR can have a trench or oxide aperture which leads to transverse optical confinement.

Gain/Current Confinement

Several gain material as well as a number known techniques for defining the position of the optical gain region in the gain medium, typically referred to as current confinement. As 'gain material' that is responsible for light generation, quantum dots, quantum wires, and quantum wells can be employed. For transverse carrier confinement, a BH structure, a tunnelling junction, or an oxide aperture can be used. Regarding contact layers, they can be formed vertically or laterally. 'Vertically' means two contact layers located above and below the active region. The doping is typically provided during the epitaxial growth. 'Laterally' means two contact regions located at the same or substantially the same vertical position in the grating, as shown in FIG. 1C. The doping is typically done by implantation.

Applications

Lasers according to the present invention can provide high modulation speed at low energy consumption. However, the output power is not so high, due to the small mode volume. Thus, these lasers are highly adequate and attractive for short-distance optical interconnects.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

REFERENCES

1. D. A. B. Miller, "Device requirements for optical interconnects to silicon chips", Proceedings of the IEEE, vol. 97, p. 1166 (2009)
2. Chang and Colden, "Efficient, High-Data-Rate, Tapered Oxide-Aperture Vertical-Cavity Surface-emitting Lasers", IEEE Journal of selected topics in quantum electronics, Vol. 15, no. 3, p. 704 (2009)
3. US 2007/0201526
4. U.S. Pat. No. 6,826,223

The invention claimed is:

1. A laser comprising:
   a cavity defined by a first mirroring structure and a second mirroring structure formed in semiconductor layers on a substrate and being arranged to support light oscillation along an oscillation axis normal to a plane of the substrate, wherein:
   the first mirroring structure is in the form of a grating formed in a first semiconductor material layer;
   an active gain material is provided within the first mirroring structure; and
   electric contacts for drawing an electric current through the active gain material to facilitate lasing, wherein the electric contacts for drawing an electric current through the active gain material are positioned in the first mirroring structure on opposite sides of the active gain material as seen in the plane of the layers.

2. The laser according to claim 1, wherein the first semiconductor material layer comprises a III-V semiconductor material.

3. The laser according to claim 1, wherein the first mirroring structure comprises a periodic active grating.

4. The laser according to claim 1, wherein the second mirroring structure comprises a periodic passive grating.

5. The laser according to claim 1, wherein either the first mirroring structure or the second mirroring structure comprises a non-periodic grating and, wherein the first and second mirroring structures are arranged to jointly support a resonance in an optical field.

6. The laser according to claim 1, wherein the second mirroring structure is provided as a distributed Bragg reflector (DBR).

7. The laser according to claim 1, wherein the electric contacts for drawing a current through the active gain material comprises p- and n-doped contact region layers forming part of the first mirroring structure and being positioned vertically above and below the active gain material layer, respectively.

8. The laser according to claim 1, wherein the electric contacts for drawing a current through the active gain material comprises p- and n-doped contact region layers forming part of the first mirroring structure and being positioned laterally on opposite sides of the active gain material.

9. The laser according to claim 1, wherein the second mirroring structure is formed by a periodic or non-periodic refractive index region in a silicon layer, and a waveguide is formed in the silicon layer, wherein the waveguide has an end part formed within or abutting the second mirror structure so as to facilitate coupling of light to the waveguide.

10. The laser according to claim 1, wherein the first and/or second mirroring structures(s) comprises periodically or non-periodically arranged perforations forming a grating region in one or two dimensions.

11. The laser according to claim 10, wherein the perforations are filled with a filling medium so that the refractive index changes periodically or non-periodically in said grating region in directions normal to said oscillation axis.

12. The laser according to claim 11, wherein the active gain material is in a semiconductor material layer and, wherein the gain material is not in contact with the filling medium in the perforations.

13. The laser according to claim 10, wherein the layer including the active gain material is structured so as to avoid regions bordering the perforations.

14. The laser according to claim 10, wherein portions of the active gain material layer border the perforations but are separated from the filling medium by a dielectric material deposited on surfaces in the perforations.

15. The laser according to claim 1, wherein the cavity further comprises a low index region between the first mirroring structure and the second mirroring structure, wherein the low index region comprises a low refractive index material.

16. The laser according to claim 15, wherein the low refractive index material is air.

17. The laser according to claim 15, wherein the low refractive index material has a refractive index of 2 or less.

18. A method of providing a modulated laser light, the method comprising:
    providing the laser of claim 1; and
    applying a modulated voltage bias between the electric contacts to modulate a laser action of the laser.

19. An optical interconnect for generation of optical data signals based on received electric data signals comprising one or more lasers according to claim 1.

20. A method for hybridizing a semiconductor laser on a silicon platform, the method comprising:
    providing regions of a second minor structure on a silicon substrate,
    wafer-bonding a III-V epi-structure including a first mirror layer and a sacrificial layer onto the patterned silicon substrate,
    forming metal contacts and corresponding implantation regions for the contacts,
    patterning a first mirror structure in the form of a grating, wherein the first minor structure comprises an active material; and
    removing the sacrificial layer.

21. A method for hybridizing a semiconductor laser on a silicon platform, the method comprising:
    providing regions of a second minor structure on a silicon substrate,
    depositing a low refractive-index material onto a III-V epi-structure so as to form a first mirror layer,
    wafer-bonding the epi-structure onto the silicon substrate,
    forming metal contacts and corresponding implantation regions for the contacts, and
    patterning a first mirror structure in the form of a grating, wherein the first minor structure comprises an active material.

* * * * *

UNITED STATES PATENT AND TRADEMARK OFFICE
CERTIFICATE OF CORRECTION

PATENT NO. : 8,948,223 B2
APPLICATION NO. : 14/123686
DATED : February 3, 2015
INVENTOR(S) : Il-Sug Chung Page 1 of 1

It is certified that error appears in the above-identified patent and that said Letters Patent is hereby corrected as shown below:

In the claims

In Claim 20, at Column 14, Line 32, change "minor" to --mirror--

In Claim 20, at Column 14, Line 40, change "minor" to --mirror--

In Claim 21, at Column 14, Line 45, change "minor" to --mirror--

In Claim 21, at Column 14, Line 53, change "minor" to --mirror--

Signed and Sealed this
Twenty-fourth Day of November, 2015

Michelle K. Lee
*Director of the United States Patent and Trademark Office*